(12) United States Patent
Chen et al.

(10) Patent No.: US 8,203,899 B2
(45) Date of Patent: *Jun. 19, 2012

(54) MEMORY CELL WITH PROPORTIONAL CURRENT SELF-REFERENCE SENSING

(75) Inventors: Yiran Chen, Eden Prairie, MN (US);
Hai Li, Eden Prairie, MN (US);
Wenzhong Zhu, Apple Valley, MN (US);
Xiaobin Wang, Chanhassen, MN (US);
Ran Wang, Irvine, CA (US); Harry Hongyue Liu, Maple Grove, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/946,582

(22) Filed: Nov. 15, 2010

(65) Prior Publication Data

US 2011/0058405 A1   Mar. 10, 2011

Related U.S. Application Data

(63) Continuation of application No. 12/406,356, filed on Mar. 18, 2009, now Pat. No. 7,852,665.

(60) Provisional application No. 61/109,967, filed on Oct. 31, 2008.

(51) Int. Cl.
*G11C 7/02* (2006.01)

(52) U.S. Cl. ........ 365/207; 365/158; 365/148; 365/163; 365/171; 365/173; 365/189.15

(58) Field of Classification Search .......... 365/158, 365/207, 148, 163, 171, 173, 189.15
See application file for complete search history.

(56) References Cited

U.S. PATENT DOCUMENTS

| | | | |
|---|---|---|---|
| 5,875,134 A | 2/1999 | Cloud | |
| 6,005,816 A | 12/1999 | Manning et al. | |
| 6,118,326 A | 9/2000 | Singer et al. | |
| 6,243,291 B1 | 6/2001 | Cheah | |
| 6,584,003 B1 | 6/2003 | Kim et al. | |
| 6,728,128 B2 | 4/2004 | Nishimura et al. | |
| 6,765,820 B2 * | 7/2004 | Lu et al. | 365/158 |
| 7,099,180 B1 * | 8/2006 | Dodge et al. | 365/148 |
| 7,116,576 B2 | 10/2006 | Smith et al. | |
| 7,154,774 B2 | 12/2006 | Bedeschi et al. | |

(Continued)

OTHER PUBLICATIONS

M. Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Proc. International Electron Device Meeting Tech. Digest, 2005 pp. 473-476, IEEE.

*Primary Examiner* — Hoai V Ho
*Assistant Examiner* — Kretelia Graham
(74) *Attorney, Agent, or Firm* — Hall Estill Attorneys at Law (57) ABSTRACT

Various embodiments of the present invention are generally directed to a method and apparatus for sensing a programmed state of a memory cell, such as a spin-torque transfer random access memory (STRAM) cell. A first read current is applied to the memory cell to generate a first voltage. A second read current is subsequently applied to the memory cell to generate a second voltage, with the second read current being proportional in magnitude to the first read current. A comparison is made between the first and second voltages to determine the programmed state of the memory cell.

20 Claims, 6 Drawing Sheets

U.S. PATENT DOCUMENTS

| | | |
|---|---|---|
| 7,161,861 B2 | 1/2007 | Gogl et al. |
| 7,266,029 B2 | 9/2007 | Jeong |
| 7,286,394 B2 | 10/2007 | Ooishi |
| 7,345,912 B2 | 3/2008 | Luo et al. |
| 7,561,461 B2 | 7/2009 | Nagai et al. |
| 7,852,665 B2 * | 12/2010 | Chen et al. .................... 365/158 |
| 2008/0056023 A1 | 3/2008 | Lee et al. |
| 2009/0323402 A1 | 12/2009 | Li et al. |
| 2009/0323403 A1 | 12/2009 | Chen et al. |
| 2010/0110760 A1 | 5/2010 | Chen et al. |

* cited by examiner

BIT WRITE OPERATION

FIG. 3

BIT READ OPERATION

MEMORY CELL WITH PROPORTIONAL CURRENT SELF-REFERENCE SENSING

RELATED APPLICATION

This application is a continuation of parent application Ser. No. 12/406,356, now issued as U.S. Pat. No. 7,852,665.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power. Non-volatile memory cells can take a variety of constructions, such as spin-torque transfer random access memory (STTRAM or STRAM), resistive random access memory (RRAM), magnetic random access memory (MRAM), etc.

In these and other types of data storage devices, the cells can be configured to have different electrical resistances to store different logical states. The resistance state of a particular cell can be detected during a read operation by applying a read current, sensing a voltage drop across the cell, and comparing the sensed voltage drop with a reference voltage.

SUMMARY

Various embodiments of the present invention are generally directed to a method and apparatus for sensing a programmed state of a memory cell, such as an STRAM cell.

In accordance with some embodiments, a method generally comprises applying a first read current to a memory cell to generate a first voltage; subsequently applying a second read current to the memory cell to generate a second voltage, wherein the second read current is proportional to the first read current; and comparing the first and second voltages to determine a programmed state of the memory cell.

In accordance with other embodiments, an apparatus generally comprises a memory cell, a first current driver circuit configured to apply a first read current to the memory cell to generate a first voltage, and a second current driver circuit configured to subsequently apply a second read current to the memory cell to generate a second voltage. The second read current is selected to be proportional to the first read current. A sense circuit is configured to compare the first and second voltages to determine a programmed state of the memory cell.

In accordance with further embodiments, an apparatus generally comprises a memory cell, and first means for applying respective first and second read currents to the memory cell to generate respective first and second voltages, and for identifying a programmed state of the memory cell by comparing said generated first and second voltages.

These and various other features and advantages which characterize the various embodiments of the present invention can be understood in view of the following detailed discussion and the accompanying drawings.

DETAILED DESCRIPTION

Figure 1:
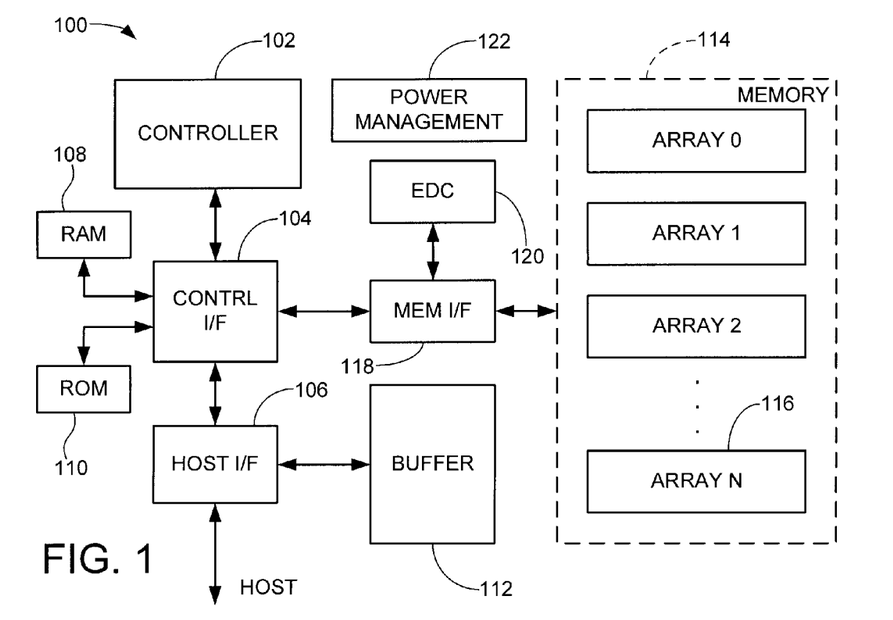
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustration and is not limiting to the claimed subject matter.

Top level control of the device 100 is carried out by a suitable controller 102, which may be a programmable or hardware based microcontroller. The controller 102 communicates with a host device via a controller interface (I/F) circuit 104 and a host I/F circuit 106. Local storage of requisite commands, programming, operational data, etc. is provided via random access memory (RAM) 108 and read-only memory (ROM) 110. A buffer 112 serves to temporarily store input write data from the host device and readback data pending transfer to the host device, as well as to facilitate serialization/deserialization of the data during a transfer operation. The buffer can be located in any suitable location, including in a portion of the array.

A memory space is shown at 114 to comprise a number of memory arrays 116 (denoted Array 0-N), although it will be appreciated that a single array can be utilized as desired. Each array 116 preferably comprises a block of semiconductor memory of selected storage capacity. Communications between the controller 102 and the memory space 114 are coordinated via a memory (MEM) I/F 118. As desired, on-the-fly error detection and correction (EDC) encoding and decoding operations are carried out during data transfers by way of an EDC block 120.

While not limiting, in an embodiment the various circuits depicted in FIG. 1 are arranged as a single chip set formed on one or more semiconductor dies with suitable encapsulation, housing and interconnection features (not separately shown for purposes of clarity). Input power to operate the device is handled by a suitable power management circuit 122 and is supplied from a suitable source such as from a battery, AC power input, etc. Power can also be supplied to the device 100 directly from the host such as through the use of a USB-style interface, etc.

Any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
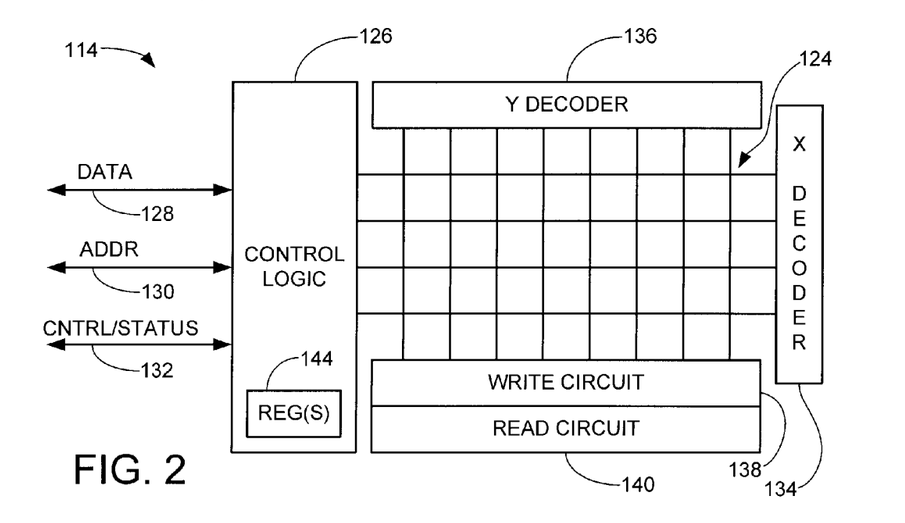
FIG. 2 shows circuitry used to read data from and write data to a memory array of the device of FIG. 1.

FIG. 2 provides a generalized representation of selected aspects of the memory space 114 of FIG. 1. Data are stored as an arrangement of rows and columns of memory cells 124, accessible by various row (word) and column (bit) lines, etc. In an embodiment, each of the array memory cells 124 has a spin-torque transfer random access memory (STTRAM or STRAM) configuration. However, it will be appreciated that such is not limiting, in that any number of different types of non-volatile or volatile memory cell constructions may be utilized, including but not limited to resistive RAM (RRAM), magnetoresistive RAM (MRAM), zero-capacitor RAM (ZRAM), static RAM (SRAM), non-volatile static RAM (nvSRAM), ferroelectric RAM (FeRAM), nano RAM (NRAM), phase-change RAM (PRAM), EEPROM, flash, dynamic RAM (DRAM), etc.

The actual configurations of the cells and the access lines thereto will depend on the requirements of a given application. Generally, however, it is contemplated that the various control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. The circuitry of FIG. 2 is merely exemplary in nature, as any number of alternative configurations can readily be employed as desired depending on the requirements of a given application.

Figure 3:
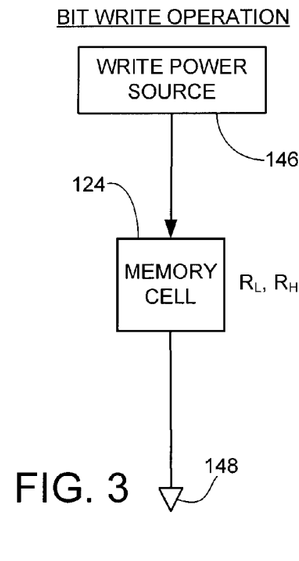
FIG. 3 generally illustrates a manner in which data are written to a memory cell of the memory array.

Data are written to the respective memory cells 124 as generally depicted in FIG. 3. Generally, a write power source 146 applies the necessary input (such as in the form of current, voltage, magnetization, etc.) to configure the memory cell 124 to a desired state. The configuration of the write power source 146, memory cell 124, and reference node 148 can be suitably manipulated to allow conventional writing of a bit with a variety of memory devices (such as SRAM, STRAM, RRAM, flash, etc).

As noted above, in an embodiment the memory cell 124 takes an STRAM configuration, in which case the write power source 146 is preferably characterized as a bi-directional current driver connected through a memory cell 124 to a suitable reference node 148, such as ground. The write power source 146 preferably provides a stream of power that is spin polarized by moving through a magnetic material in the memory cell 124. The resulting rotation of the polarized spins creates a torque that changes the magnetic moment of the memory cell 124.

Depending on the orientation of the applied write current, the cell 124 may take either a relatively low resistance ($R_L$) or a relatively high resistance ($R_H$). While not limiting, exemplary $R_L$ values may be in the range of about 2000 ohms (Ω) or so, whereas exemplary $R_H$ values may be in the range of about 100KΩ or so. Other resistive memory type configurations (e.g., RRAMs) are supplied with a suitable voltage or other input to similarly provide respective $R_L$ and $R_H$ values. These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

Figure 4:
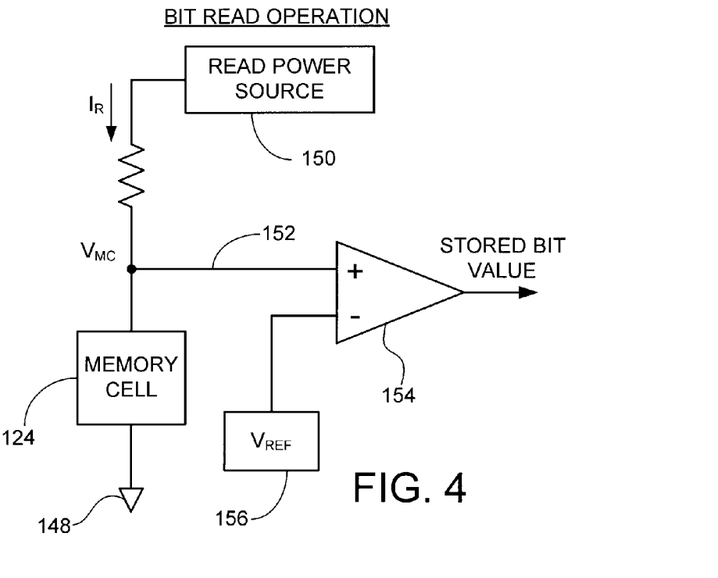
FIG. 4 generally illustrates a manner in which data are read from the memory cell of FIG. 3.

The logical bit value(s) stored by each cell 124 can be determined in a manner such as illustrated by FIG. 4. A read power source 150 applies an appropriate input (e.g., a selected read voltage) to the memory cell 124. The amount of read current $I_R$ that flows through the cell 124 will be a function of the resistance of the cell ($R_L$ or $R_H$, respectively). In the case of STRAM, as well as other types of memory configurations such as RRAM, the read current magnitude will generally be significantly lower than the write current magnitude utilized to set the storage state of the bit. The voltage drop across the memory cell (voltage $V_{MC}$) is sensed via path 152 by the positive (+) input of a comparator 154. A suitable reference (such as voltage reference $V_{REF}$) is supplied to the negative (−) input of the comparator 154 from a reference source 156.

The reference voltage $V_{REF}$ is preferably selected such that the voltage drop $V_{MC}$ across the memory cell 124 will be lower than the $V_{REF}$ value when the resistance of the cell is set to $R_L$, and will be higher than the $V_{REF}$ value when the resistance of the cell is set to $R_H$. In this way, the output voltage level of the comparator 154 will indicate the logical bit value (0 or 1) stored by the memory cell 124.

In some embodiments, the memory cells 124 are characterized as so-called resistive sense memory (RSM) cells. As used herein, RSM cells are generally described as cells configured to have different electrical resistances which are used to store different logical states. The resistance of the cells can be subsequently detected during a read operation by applying a read current and sensing a signal in relation to a voltage drop across the cell. Exemplary types of RSM cells include STRAM, RRAM, magnetic random access memory (MRAM), etc.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life.

Figure 5:
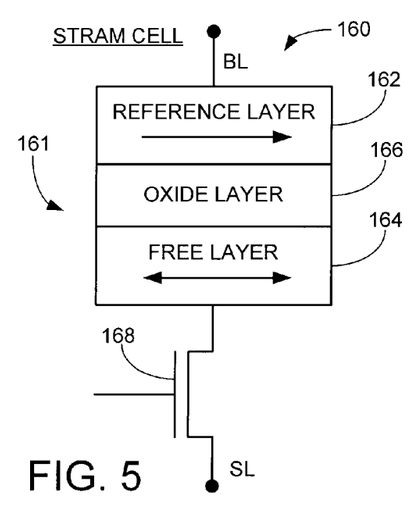
FIG. 5 shows an exemplary construction for a spin-torque transfer random access memory (STTRAM or STRAM) cell.

FIG. 5 shows an exemplary STRAM cell 160. The STRAM cell 160 includes a magnetic tunneling junction (MTJ) 161 formed from two ferromagnetic layers 162, 164 separated by an oxide barrier layer 166 (such as magnesium oxide, MgO). The resistance of the MTJ 161 is determined in relation to the relative magnetization directions of the ferromagnetic layers 162, 164: when the magnetization is in the same direction, the MTJ is in the low resistance state ($R_L$); when the magnetization is in opposite directions, the MTJ is in the high resistance state ($R_H$).

In some embodiments, the magnetization direction of the reference layer 162 is fixed by coupling to a pinned magnetization layer (e.g., a permanent magnet, etc.), and the magnetization direction of the free layer 164 can be changed by passing a driving current polarized by magnetization in the reference layer 162.

To read the logic state stored by the MTJ 161, a relatively small current is passed through the MTJ between a source line (SL) and a bit line (BL). Because of the difference between the low and high resistances of the MTJ 161 in the respective logical 0 and 1 states, the voltage at the bit line will be different, which can be sensed using a suitable sense amplifier. A switching device 168 allows selective access to the MTJ 161 during read and write operations.

Figure 6:
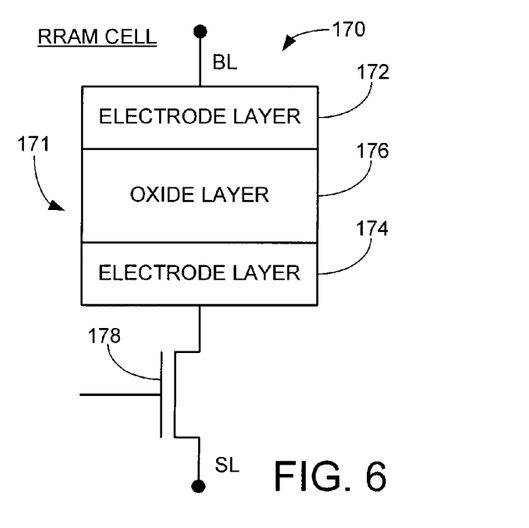
FIG. 6 shows an exemplary construction for a resistive random access memory (RRAM) cell.

FIG. 6 illustrates an RRAM cell 170 as an alternative RSM cell construction. The RRAM cell 170 provides a resistive sense element 171 with opposing electrode layers 172, 174 and an oxide layer 176. The oxide layer 176 may be configured to have a nominally high resistance (e.g., $R_H$). The resistance of the oxide layer, however, can be lowered (e.g., $R_L$) through application of a relatively high write voltage across the RRAM cell 170. Such voltage generates lower resistance paths (filaments) as components of a selected electrode layer 172, 174 migrate into the oxide layer 176.

The oxide layer 176 can be restored to its original, higher resistance through application of a corresponding voltage of opposite polarity. As with the STRAM cell 160 of FIG. 5, the storage state of the RRAM cell 170 of FIG. 6 can be read by passing a read current from a source line (SL) to a bit line (BL), and sensing the resistance of the cell in a manner such as shown in FIG. 4. A switching device 178 facilitates access to the RRAM cell.

The sensing of the programmed resistive state of an RSM cell, such as the STRAM cell 160 of FIG. 5 or the RRAM cell 170 of FIG. 6, should be carried out in such a way as to accurately and reliably distinguish between the high and low resistive states. If programmed high, the sensed voltage across the cell will be relatively high and can be expressed as:

$$V_{MAX}=I_R(R_{MAX}+R_{TR}) \quad (1)$$

where $V_{MAX}$ is the sensed voltage, $I_R$ is the read current, $R_{MAX}$ is the programmed high resistance of the resistive sense element (such as MTJ 161 in FIG. 5), and $R_{TR}$ is the drain-to-source resistance of the transistor (such as the device 168 in FIG. 5). Similarly, if programmed low, the sensed voltage across the cell will be relatively low and can be expressed as:

$$V_{MIN}=I_R(R_{MIN}+R_{TR}) \quad (2)$$

where $V_{MIN}$ is the sensed voltage, $I_R$ is the read current, $R_{MIN}$ is the programmed low resistance of the resistive sense element (such as MTJ 161 in FIG. 5), and $R_{TR}$ is the drain-to-source resistance of the transistor (such as the device 168 in FIG. 5). The voltage differential $\Delta V$ between $V_{MAX}$ and $V_{MIN}$ can be expressed as:

$$\Delta V=V_{MAX}-V_{MIN}=I_R(R_{MAX}-R_{MIN}) \quad (3)$$

The voltage differential $\Delta V$ constitutes the available margin for resistive state detection.

A problem arises when insufficient margin is available to select a reference voltage $V_{REF}$ that falls within the $\Delta V$ differential, that is, $V_{MAX}>V_{REF}>V_{MIN}$. Due to a number of factors such as manufacturing process variations and operational conditions, a reference voltage $V_{REF}$ that is suitable for resistive state detection of some cells within the array may not be suitable for resistive state detection in other cells. This may lead to incorrect detection of the resistive state of the cells, and erroneous data being read back from the array.

Accordingly, various embodiments of the present invention are generally directed to providing a dual stage self-reference sensing scheme for the memory cells in a resistive sense memory array. As explained below, the scheme generally applies different magnitudes of read currents to a memory cell. This provides different readback voltages that are compared to discern the resistive state of the cell. In some embodiments, a dual-stage sense amplifier structure is further used to improve the efficiency of the voltage sense operation.

Figure 7:
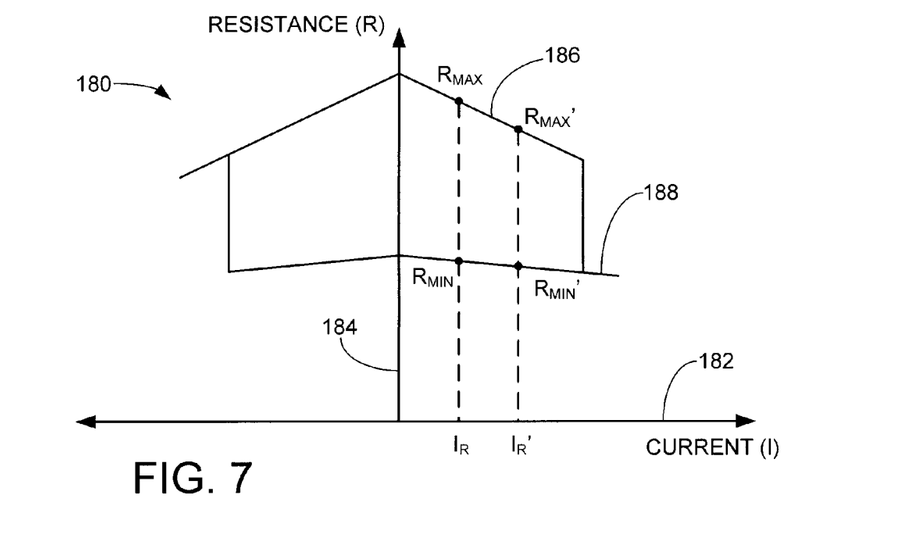
FIG. 7 provides a graphical representation of current and voltage characteristics of the STRAM cell of FIG. 5.

To explain these various features, reference is made to FIG. 7 which provides a voltage-current (V-I) curve 180 for a selected RSM cell 124, in this case the STRAM cell 160 of FIG. 5. The curve 180 is plotted against a current magnitude x-axis 182 and a resistance magnitude y-axis 184.

A first portion 186 of the curve 180 represents the resistance of the STRAM cell 160 when the MTJ 161 is programmed to the high resistance $R_{MAX}$. That is, for various applied read currents, the portion 182 shows the corresponding resistance of the STRAM cell 160 when the MTJ 161 is programmed to the high resistance.

A second portion 188 of the curve 180 represents the resistance of the STRAM cell 160 when the MTJ 161 is programmed to the low resistance $R_{MIN}$. The $R_{MIN}$ portion 188 is relatively flat (i.e., has a substantially smaller slope) as compared to the $R_{MAX}$ portion 186. Applying a selected magnitude of read current $I_R$ to the cell 160 will provide different voltages corresponding to the different possible programmed resistances ($R_{MIN}$ or $R_{MAX}$) of the MTJ 161.

Figure 8:
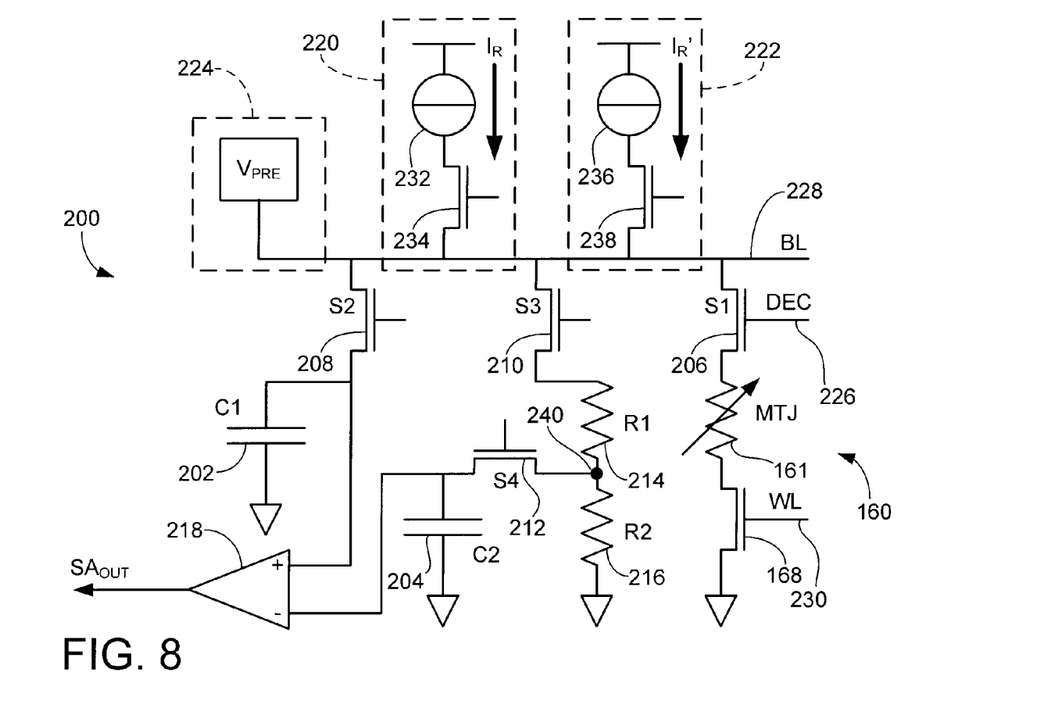
FIG. 8 is a read circuit constructed in accordance with various embodiments of the present invention.

FIG. 8 shows a read circuit 200 configured in accordance with various embodiments to read the programmed resistive state of the STRAM cell 160 of FIG. 7. The circuit includes a number of components which will be initially identified prior to an explanation of the operation of the circuit. These components include first and second capacitors 202, 204 (C1 and C2); a number of switching devices 206, 208, 210 and 212 (S1-S4); first and second resistors 214, 216 (R1 and R2); a sense amplifier 218; first and second current sources 220, 222; and a pre-charge source 224.

The S1-S4 switching devices are characterized as NMOS transistors, although other configurations can be used. The S1 device 206 allows individual selection of the cell 160, and is asserted via a decoder line 226. Only a single stage sense amplifier 218 is shown in FIG. 8 to facilitate the present discussion; a more complex, and faster response dual stage sense amplifier arrangement will be discussed below.

During a read operation upon the cell 160, a bit line (BL) 228 coupled to the cell 160 is pre-charged with a voltage $V_{PRE}$ from the pre-charge source 224. While optional, such pre-charging can improve the speed at which the cell 160 is read. To read the cell 160, a word line 230 (WL) is asserted to place the cell transistor 168 in a drain-to-source conductive state, the decoder line 226 is asserted to place the S1 device 206 in a conductive state, and a first read current $I_R$ is applied to the cell 160 from the first read current source 220.

The first read current source 220 includes a current driver 232 and a switching device 234. Assertion of the switching device 234 allows the first read current $I_R$ to pass from the driver 232 to the BL 228 and through the MTJ 161 to ground. The voltage at the BL 228 will be proportional to the voltage drop across the MTJ 161. Those skilled in the art will recognize that this voltage will also include the small forward conduction drops across the S1 device 206 and the cell transistor 168, but these will be relatively small compared to the voltage drop across the MTJ 161, and will be substantially the same each time current is applied to the cell. Thus, the voltage on the BL 228 resulting from the first read current $I_R$ can be used as an indication of the voltage drop across the MTJ 161, and hence, the programmed state thereof.

The S2 switching device 208 is asserted so that the voltage on the BL 228 is stored on the C1 capacitor 202. The S2 switching device is deasserted to retain this voltage on the C1 capacitor.

A second read current $I_R'$ is applied to the BL 228 from the second current source 222 via current driver 236 and switching device 238. The second read current $I_R'$ is selected to be proportional in magnitude to the first read current (i.e., $I_R' = (I_R)$ times (x) where x is some non-unity value) in a manner to be discussed below.

The second read current $I_R'$ also results in a voltage being presented on the BL 228. The S3 and S4 switching devices 210, 212 are asserted, so that a second voltage is stored on the C2 capacitor 204 that is proportional to both the voltage drop across the MTJ 161, as well as the voltage divider formed by the R1 and R2 resistors 214, 216. That is the voltage across the MTJ 161 is divided by the ratio of the R1 and R2 resistors 214, 216 so that the second voltage substantially corresponds to the voltage at a node 240 between the R1 and R2 resistors.

This second voltage $V_2$ generally constitutes a reference voltage $V_{REF}$ for the first voltage $V_1$ stored on the C1 capacitor 202. The first and second voltages $V_1$ and $V_2$ on the respective C1 and C2 capacitors 202, 204 are compared through provision of the voltages to respective input terminals of the sense amplifier 218. This comparison results in the generation of a sense amplifier output ($SA_{OUT}$) indicative of the storage state of the MTJ 161.

The ability of the sense amplifier 218 to correctly discern the storage state of the MTJ 161 will depend on a number of factors, including the respective values for the first and second read currents $I_R$ and $I_R'$ and the respective resistance values of the R1 and R2 resistors 214, 216. Referring again to FIG. 7, it will be recalled that the voltage portion 188 for $R_{MIN}$ is substantially flat. This means that the $R_{MIN}$ value for the first read current $I_R$ will be substantially equal to the $R_{MIN}'$ value for the second read current $I_R'$, that is, $$R_{MIN} \approx R_{MIN}' \quad (4)$$

The forward resistance of the cell transistor 168 $R_{TR}$ will be substantially the same for both read currents since the transistor will be operating in the linear region in both cases, so $$R_{TR} \approx R_{TR}' \quad (5)$$

If the programmed state of the MTJ 161 in FIG. 8 is to the low resistance $R_{MIN}$, and the voltage drop across the S1 device 206 is ignored (since it will be substantially the same in each case), then the first voltage $V_1$ on the C1 capacitor 202 can be generally expressed as:

$$V_1 = I_R(R_{MIN} + R_{TR}) \quad (6)$$

The second voltage $V_2$ stored on the C2 capacitor 204 can be generally expressed as:

$$V_2 = I_R'(R_{MIN}' + R_{TR}') \frac{R2}{(R1 + R2)} \quad (7)$$

If the respective magnitudes of R1 and R2 are selected to provide $$I_R = I_R' \frac{R2}{(R1 + R2)} \quad (8)$$

then combining equations (6) and (7) provides $$V_1 - V_2 = I_R(R_{MIN} - R_{MIN}') \approx 0 \quad (9)$$

Thus, when the MTJ 161 in FIG. 8 is programmed to the low resistance state $R_{MIN}$, the respective voltages V1 and V2 on the C1 and C2 capacitors 202, 204 will be substantially equal, and the output of the sense amplifier 218 will be substantially zero.

By contrast, when the MTJ 161 in FIG. 8 is programmed to the high resistance state $R_{MAX}$, the voltage $V_1$ on the C1 capacitor 202 can be generally expressed as:

$$V_1 = I_R(R_{MAX} + R_{TR}) \quad (10)$$

The second voltage $V_2$ stored on the C2 capacitor 204 can be generally expressed as:

$$V_2 = I_R'(R_{MAX}' + R_{TR}') \frac{R2}{(R1 + R2)} \quad (11)$$

Combining equations (10) and (11) provides:

$$V_1 - V_2 = I_R(R_{MAX} - R_{MAX}') \gg 0 \quad (12)$$

Thus, the voltage differential between the voltages V1 and V2 on the respective C1 and C2 capacitors 202, 204 will be substantially greater than zero when the MTJ 161 in FIG. 8 is programmed to the high resistance $R_{MAX}$. In some embodiments, a small threshold value (e.g., $\Delta > 0$) can be used to discern whether the difference between the respective voltages $V_1$ and $V_2$ is large enough to indicate that the programmed state of the MTJ is high.

Figure 9:
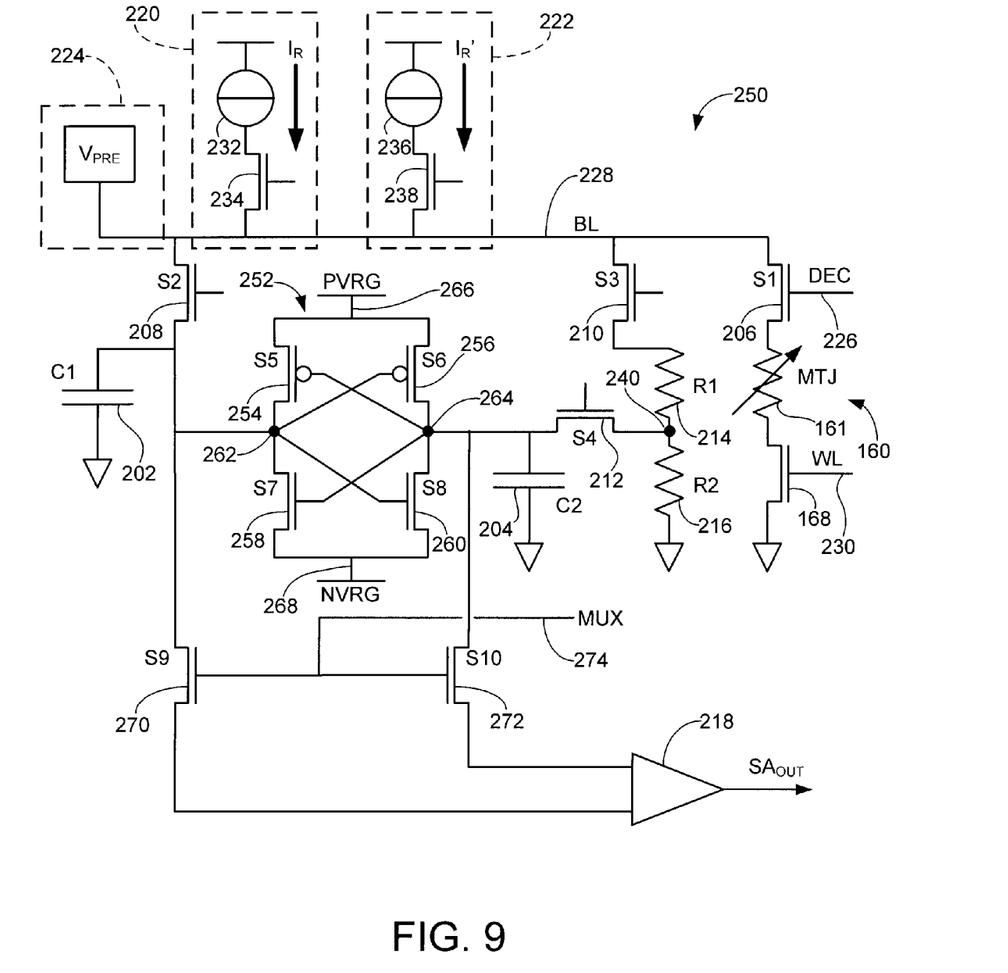
FIG. 9 is an alternative read circuit in accordance with various embodiments.

FIG. 9 provides an alternative read circuit 250 configured in accordance with various embodiments to read the programmed resistive state of the STRAM cell 160. The read circuit 250 is generally similar to the circuit 200 of FIG. 8, and like reference numerals are used for similar components in each of the figures.

One difference between the circuits 200, 250 in FIGS. 8 and 9 is the incorporation of a dual stage sensing operation in FIG. 9. More specifically, FIG. 9 includes a cross-coupled differential sense amplifier circuit 252. The circuit 252 operates as an upstream, first stage amplifier circuit to initially sense the voltage differential between the $V_1$ and $V_2$ voltages to a certain differential range (opening), after which the downstream second stage amplifier 218 is activated to pull the differential to full swing.

The first stage amplifier circuit 252 comprises four cross-connected switching devices 254, 256, 258 and 260 denoted as S5 through S8. The S5 and S6 devices 254, 256 are characterized as PMOS transistors, and the S7 and S8 devices 258, 260 are characterized as NMOS transistors, although other configurations can be used.

A first terminal, or sense node 262 is coupled to the C1 capacitor 202, and a second terminal, or sense node 264 is coupled to the C2 capacitor 204. Suitable rail voltages are supplied to the circuit 252 via a positive voltage range (PRVG) source 266 and a negative voltage range (NVRG) source 268. A pair of switching devices (NMOS transistors) 270, 272 are denoted as S9 and S10 and are respectively coupled to the sense nodes 262 and 264. The devices 270, 272 are asserted via a MUX line 274 to connect the first stage sense circuit 252 to the second stage sense amplifier 218. Although not shown in FIG. 9, additional switching circuitry can be used to share the second stage sense amplifier 218 among multiple first stage sense amplifiers 252.

The circuit 250 of FIG. 9 operates substantially as described above to provide V1 and V2 voltages on the C1 and C2 capacitors 202, 204 responsive to successively applied, first and second read currents $I_R$ and $I_R'$. The voltage differential between sense nodes 262 and 264 will be enhanced in relation to differences between the V1 and V2 voltages, so that when the second stage amplifier 218 is switched in via MUX line 274, the final $SA_{OUT}$ value can be quickly obtained.

Figure 10:
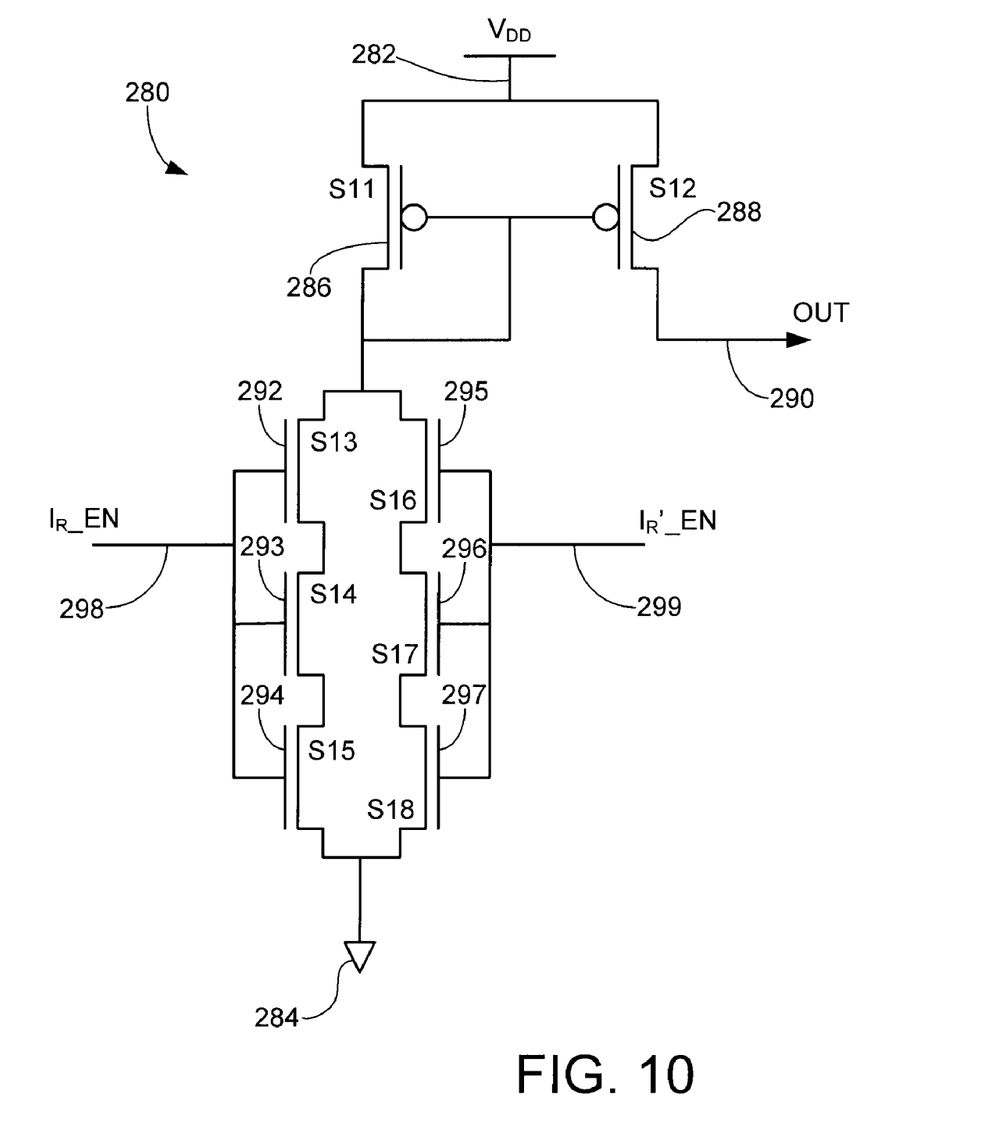
FIG. 10 provides an exemplary programmable current driver for use with the circuits of FIGS. 8-9.

FIG. 10 shows an exemplary programmable current driver circuit 280 that can be advantageously used to generate the first and second $I_R$ and $I_R'$ read currents. The circuit 280 in FIG. 10 thus constitutes one possible implementation of both current drivers 232 and 236 in FIGS. 8-9. Other configurations can readily be used, however.

The driver circuit 280 is connected across a voltage $V_{DD}$ from a source 282 and a reference level 284, such as ground. Switching devices 286, 288, configured as PMOS transistors and denoted as S11 and S12, are coupled to the source 282 as shown. An output line 290 provides the commanded current.

Two parallel sets of switching devices S13-S18 are coupled between the S11-S12 devices and ground 284. These S13-S18 devices are individually denoted at 292, 293, 294, 295, 296 and 297, respectively. The S13-S15 devices have gates concurrently asserted by a first current enable signal ($I_R$_EN) on path 298, and the S16-S18 devices are similarly asserted by a second current enable signal ($I_R'$_EN) on path 299.

During operation, the driver circuit 280 outputs the first read current $I_R$ responsive to magnitude of the $I_R$_EN signal (first gate voltage), and the driver circuit 280 outputs the second read current $I_R$ responsive to the magnitude of the $I_R'$_EN signal (second gate voltage). In this way, a common driver circuit 280 can be configured to separately provide different respective first and second read currents for different cells. As desired, multi-bit digital values representative of the desired read current magnitudes can be stored in a suitable location in memory, and supplied to a digital-to-analog converter (DAC, not shown) to generate the respective currents. As will be appreciated, any number of other configurations for the current drivers 234 and 236 of FIGS. 8-9 can be used, so the foregoing is merely illustrative and not limiting.

Figure 11:
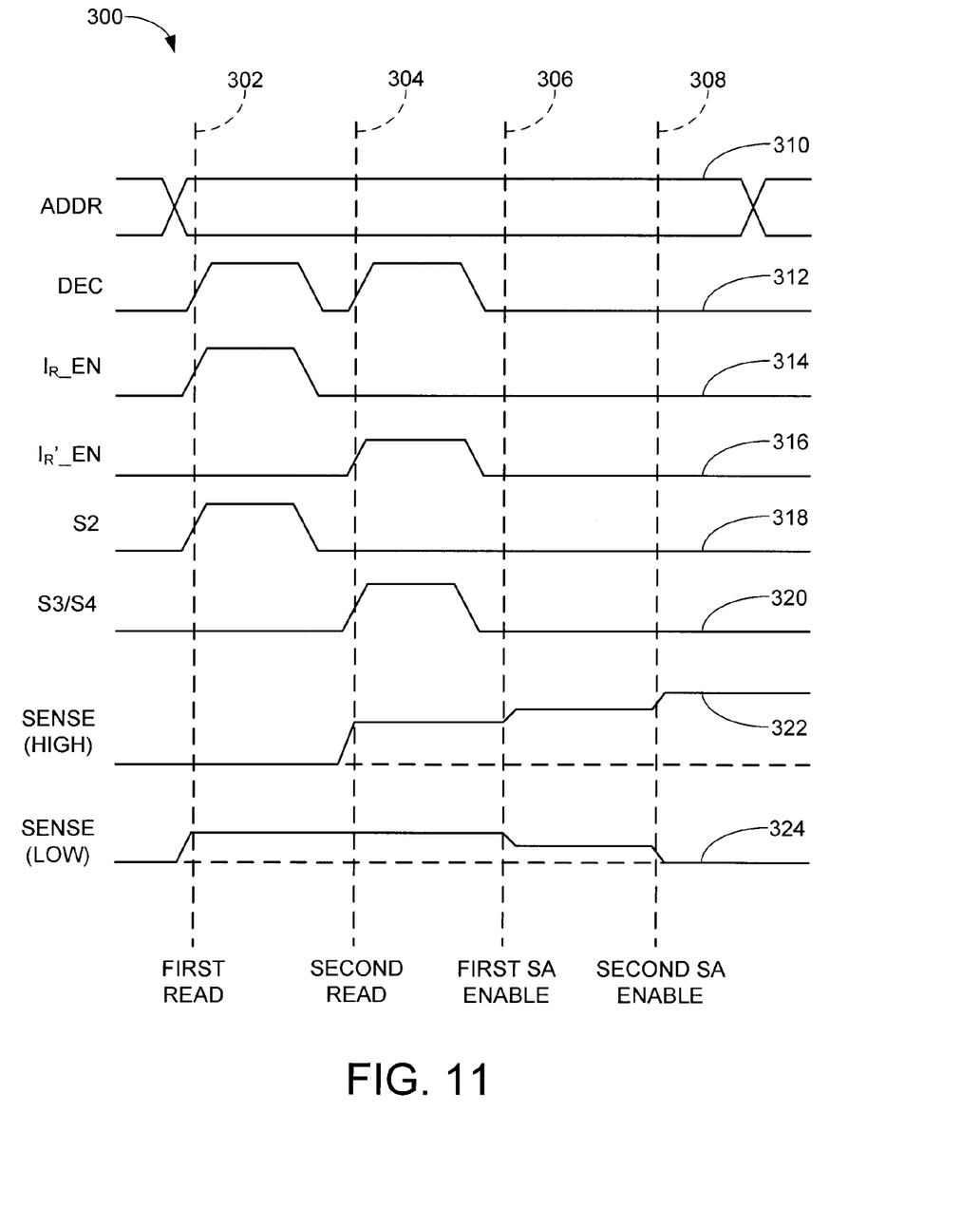
FIG. 11 provides a timing diagram for the operation of the circuit of FIG. 9.

FIG. 11 sets forth an exemplary timing diagram 300 for various signals utilized in the operation of the circuit 250 of FIG. 9. It will be appreciated that aspects of the timing diagram of FIG. 11 are also applicable to the operation of the circuit 200 of FIG. 8.

The diagram 300 is generally divided into four time intervals which are bounded by vertically extending dashed lines 302, 304, 306 and 308. These time intervals will generally occur at appropriate times during the read operation, and may not necessarily be equally spaced in the manner shown in FIG. 11.

For reference, the first time interval between lines 302 and 304 constitutes the first read operation on the MTJ 161 using the first read current $I_R$. The second time interval (304-306) constitutes the second read operation on the MTJ 161 using the second read current $I_R'$. The third time interval (306-308) is a first stage sensing operation using the first stage sense amplifier circuit 252, and the fourth time interval (308 and beyond) represents the second stage operation using the output sense amplifier 218.

A complementary address (ADDR) signal 310 generally serves as a read gate to initialize the read operation upon the selected cell 160. The ADDR signal 310 is asserted during the entirety of the read operation. A decoder (DEC) signal 312 asserts the S1 device 206 in FIG. 9 at the appropriate times to allow passage of the respective first and second read currents, as indicated by $I_R$_EN and $I_R'$_EN signals 314 and 316 (see FIG. 10).

The S2 device 208 (FIG. 9) is asserted during the first time interval as shown by signal 318, thereby allowing the V1 voltage to be stored on the C1 capacitor 202. The S3 and S4 devices 210, 212 (FIG. 9) are asserted during the second time interval as shown by signal 320, allowing the V2 voltage to be stored on the C2 capacitor 204.

FIG. 11 further shows respective sense response signals SENSE (HIGH) 322 and SENSE (LOW) 324. These signals 322, 324 indicate the sensing levels by the dual stage sense circuits 252 and 218 (FIG. 9) during the read operation.

When the MTJ 161 (FIG. 9) is programmed to the high resistance state, as shown by response signal 322 the voltage differential between the $V_1$ and $V_2$ voltages will be relatively high. This allows the first stage amplifier 252 to initiate the voltage differential swing between sense nodes 262 and 264. Once the second stage amplifier 218 is turned on (via switches 270, 272), the full range of voltage differential is sensed and output by the amplifier.

By contrast, when the MTJ 161 is programmed to the low resistance state, a voltage differential will initially exist during the time prior to the storage of the second voltage $V_2$ on the C2 capacitor 204. Once the second voltage $V_2$ is captured, however, the $V_1$ and $V_2$ voltages will be substantially equal and the second stage amplifier 218 will ultimately be pulled low, as shown.

It will now be appreciated that the various embodiments presented herein provide various advantages over the prior art. The use of different, proportional read currents through the same memory cell allow the generation of a suitable reference voltage differential based on the actual characteristics of that cell. That is, irrespective of whether the cell exhibits resistance characteristics that are at a low end, a high end, or a median level with regard to the overall population of resistance characteristics for all of the memory cells in an array, a reference voltage can be individually tailored for that cell that quickly and accurately determines the programmed state of that cell. While not necessarily required, the use of dual sense stages further advantageously decreases the time required to complete the sense operation upon the programmed state of the cell.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method comprising:
sequentially applying first and second read currents to a memory cell to respectively generate first and second voltages;
using a first stage differential sense amplifier to initially sense a voltage differential between the first and second voltages; and
utilizing a second stage sense amplifier to output a bit value with a logic level corresponding to a programmed state of the memory cell responsive to said sensed voltage differential between the first and second voltages, wherein the memory cell is alternately programmable to a low resistance state and a high resistance state, respectively, wherein the first voltage is substantially equal to the second voltage when the memory cell is programmed to the low resistance state, and wherein the first voltage is substantially greater than the second voltage when the memory cell is programmed to the high resistance state.

2. The method of claim 1, wherein the sequentially applying step comprises storing the first voltage on a first capacitor and storing the second voltage on a second capacitor.

3. The method of claim 1, further comprising a prior step of applying a write current to the memory cell to establish said programmed state of the memory cell.

4. The method of claim 1, wherein the respective first and second voltages have magnitudes in relation to respective voltage drops across the memory cell from the application of the respective first and second read currents.

5. The method of claim 1, wherein the magnitude of the second voltage is generated in relation to a voltage divider comprising first and second resistors with corresponding first and second resistances, and wherein the second read current has a magnitude selected in relation to a ratio of said first and second resistances.

6. The method of claim 1, wherein a programmable current driver is used to sequentially output the first and second read currents to the memory cell.

7. The method of claim 1, wherein the first and second read currents are sequentially applied to the memory cell by a single programmable current driver responsive to first and second current output enable signals, the first and second read currents respectively proportional in magnitude to the first and second current output enable signals.

8. The method of claim 1, in which the memory cell is characterized as a spin-torque transfer random access memory (STRAM) cell comprising a magnetic tunneling junction (MTJ) and a switching device.

9. A semiconductor memory, comprising:
an array of memory cells, each cell in said array adapted to store a bit value in relation to a programmable electrical resistance of the cell; and
a read circuit adapted to read the stored bit value of a selected memory cell of the array, comprising a current generator adapted to sequentially apply first and second read currents to the selected memory cell to generate respective first and second voltages, a first stage differential sense amplifier adapted to sense a voltage differential between the first and second voltages, and a second stage sense amplifier adapted to output a bit value with a logic level corresponding to the stored bit value in relation to the sensed voltage differential, the current generator characterized as a single programmable current driver used to sequentially output the first and second read currents responsive to first and second current output enable signals, the first and second read currents respectively proportional in magnitude to the first and second current output enable signals.

10. The memory of claim 9, in which each of the memory cells in the array is characterized as a spin-torque transfer random access memory (STRAM) cell comprising a magnetic tunneling junction (MTJ) selectively programmable between a low resistance state and a high resistance state in series with a switching device.

11. The memory of claim 9, in which the read circuit further comprises first and second capacitors adapted to respectively store the first and second voltages.

12. The memory of claim 9, in which the respective first and second voltages have magnitudes in relation to respective voltage drops across the selected memory cell from the respective first and second read currents.

13. The memory of claim 9, in which the read circuit further comprises a voltage divider switchably coupled to the selected memory cell comprising first and second resistors with corresponding first and second resistances, the second voltage generated at a node between said first and second resistors and having a magnitude established in relation to said first and second resistances.

14. The memory of claim 9, in which the semiconductor memory is incorporated into a portable data storage device.

15. The memory of claim 9, in which the memory cell is alternately programmable to a low resistance state and a high resistance state, respectively, the first voltage is substantially equal to the second voltage when the memory cell is programmed to the low resistance state, and the first voltage is substantially greater than the second voltage when the memory cell is programmed to the high resistance state.

16. A portable data storage device, comprising:
a memory space comprising an array of non-volatile memory cells;
a write circuit adapted to apply write currents to the array to program the memory cells to different programmed states;
a current generator adapted to sequentially apply different magnitude first and second read currents to a selected memory cell to generate first and second voltages,
a first stage cross-coupled differential sense amplifier adapted to sense a voltage differential between the first and second voltages; and
a second stage sense amplifier adapted to output a bit value with a logic level corresponding to the programmed state of the memory cell responsive to the sensed voltage differential, wherein the selected memory cell is alternately programmable to a low resistance state and a high resistance state, respectively, wherein the first voltage is substantially equal to the second voltage when the selected memory cell is programmed to the low resistance state, and wherein the first voltage is substantially greater than the second voltage when the selected memory cell is programmed to the high resistance state.

17. The storage device of claim 16, further comprising a voltage divider comprising a first resistor in series with a second resistor, wherein the second voltage is generated at a node between the first and second resistors with a magnitude established in relation to a ratio of an overall resistance of the first resistor and an overall resistance of the second resistor.

18. The storage device of claim 16, further comprising a first capacitor adapted to store the first voltage, and a second capacitor adapted to store the second voltage.

19. The storage device of claim 16, in which the current generator characterized as a single programmable current driver used to sequentially output the first and second read currents responsive to first and second current output enable signals, the first and second read currents respectively proportional in magnitude to the first and second current output enable signals.

20. The storage device of claim 16, in which the current generator and the first and second sense amplifiers are adapted to sequentially read the programmed state of each of a plurality of the memory cells in the array in turn.

* * * * *